US010551555B2

(12) United States Patent
Park et al.

(10) Patent No.: US 10,551,555 B2
(45) Date of Patent: Feb. 4, 2020

(54) BACKLIGHT UNIT RESTRICTING SUBSTRATE MOVEMENT AND DISPLAY APPARATUS INCLUDING THE SAME

(71) Applicant: Samsung Display Co., Ltd., Yongin-Si, Gyeonggi-Do (KR)

(72) Inventors: Young-min Park, Hwaseong-si (KR); Dohun Kim, Suwon-si (KR); Taek-sun Shin, Yongin-si (KR)

(73) Assignee: SAMSUNG DISPLAY CO., LTD., Gyeonggi-Do (KR)

(*) Notice: Subject to any disclaimer, the term of this patent is extended or adjusted under 35 U.S.C. 154(b) by 235 days.

(21) Appl. No.: 15/828,593

(22) Filed: Dec. 1, 2017

(65) Prior Publication Data

US 2018/0356585 A1 Dec. 13, 2018

(30) Foreign Application Priority Data

Jun. 9, 2017 (KR) .................. 10-2017-0072741

(51) Int. Cl.
*F21V 8/00* (2006.01)
*H05K 1/14* (2006.01)
*G02F 1/1335* (2006.01)
*G02F 1/1333* (2006.01)

(52) U.S. Cl.
CPC ..... *G02B 6/0083* (2013.01); *G02F 1/133615* (2013.01); *H05K 1/148* (2013.01); *G02B 6/009* (2013.01); *G02F 2001/133325* (2013.01); *H05K 1/147* (2013.01); *H05K 2201/09027* (2013.01); *H05K 2201/10106* (2013.01); *H05K 2201/10136* (2013.01); *H05K 2201/10189* (2013.01); *H05K 2201/10424* (2013.01)

(58) Field of Classification Search
CPC .......... H05K 2201/09027; H05K 2201/10106; H05K 2201/10189; H05K 1/148; G02B 6/009; G02B 6/0083
USPC ........................................................ 362/631
See application file for complete search history.

(56) References Cited

U.S. PATENT DOCUMENTS

| 7,976,183 B2* | 7/2011 | Park | G02F 1/133604 |
| | | | 362/221 |
| 2012/0014135 A1* | 1/2012 | Kim | G02F 1/133615 |
| | | | 362/623 |
| 2013/0182408 A1* | 7/2013 | Kwon | F21V 21/00 |
| | | | 362/257 |

(Continued)

FOREIGN PATENT DOCUMENTS

| KR | 101029639 B1 | 4/2011 |
| KR | 101265372 B1 | 5/2013 |
| KR | 1020160141085 A | 12/2016 |

*Primary Examiner* — Michael G Lee
*Assistant Examiner* — David Tardif
(74) *Attorney, Agent, or Firm* — Cantor Colburn LLP

(57) ABSTRACT

A display apparatus includes a display panel and a backlight unit. The backlight unit includes a light source, a first substrate on which the light source is mounted, a driving substrate which supplies driving power to the light source, a second substrate connecting the first substrate to the driving substrate, a connector mounted on the driving substrate and coupled to the second substrate, and a dam mounted on the driving substrate and facing the connector with the second substrate interposed therebetween. The dam restricts movement of the second substrate in a direction away from the connector.

19 Claims, 7 Drawing Sheets

(56) References Cited

U.S. PATENT DOCUMENTS

| | | | | |
|---|---|---|---|---|
| 2014/0177242 A1* | 6/2014 | Nam | .................... | H01L 25/0753 |
| | | | | 362/382 |
| 2015/0009714 A1* | 1/2015 | Okano | ................. | G02B 6/0073 |
| | | | | 362/631 |
| 2015/0085527 A1* | 3/2015 | Nam | ....................... | H01L 33/60 |
| | | | | 362/612 |
| 2015/0369993 A1* | 12/2015 | Kim | ....................... | G02B 6/009 |
| | | | | 362/610 |

* cited by examiner

BACKLIGHT UNIT RESTRICTING SUBSTRATE MOVEMENT AND DISPLAY APPARATUS INCLUDING THE SAME

This application claims priority to Korean Patent Application No. 10-2017-0072741, filed on Jun. 9, 2017, and all the benefits accruing therefrom under 35 U.S.C. § 119, the content of which in its entirety is herein incorporated by reference.

BACKGROUND

1. Field

Embodiments of the invention relate to a display apparatus and, more particularly, to a display apparatus having a structure capable of reducing or effectively preventing assembly errors thereof.

2. Description of the Related Art

Display apparatuses may include a liquid crystal display apparatus, an electrowetting display apparatus and an electrophoretic display apparatus. The display apparatuses may include light-receiving display panels and additional backlight units which provide light to the display panels.

Backlight units may be classified into edge-type backlight units and direct-type backlight units on the basis of relative positions of a light source with respect to a display surface on which an image is displayed.

An overall thickness of the edge-type backlight unit may be smaller than that of the direct-type backlight unit. Thus, portable display apparatuses may mainly use the edge-type backlight units due to the smaller overall thicknesses thereof.

SUMMARY

Embodiments of the invention provide a display apparatus of which assembly reliability is improved by improving a coupling force between a driving substrate and a light source substrate coupled to a connector of the driving substrate.

In an embodiment, a display apparatus includes a display panel which displays an image with light and a backlight unit which provides the light to the display panel.

The backlight unit includes a light source, a first substrate, a driving substrate, a second substrate, a connector and a dam.

The light source generates and emits the light and is mounted on the first substrate. The driving substrate supplies driving power to the light source.

The second substrate connects the first substrate to the driving substrate. The second substrate may have a shape that is bent at least once. The second substrate may include a plug at a first end of the second substrate, and the plug may be inserted into a plug engaging hole defined in the connector, in a first direction.

In some embodiments, the first substrate may be integrated with the second substrate as a single unitary body.

The connector is mounted on the driving substrate and is coupled to the second substrate. The dam is mounted on the driving substrate and faces the connector with the second substrate interposed therebetween.

The dam, the second substrate and the connector may be spaced apart from each other in the first direction. The plug of the second substrate inserted into the plug engaging hole of the connector may define: a length of the plug in the first direction which is inside the connector, and a distance between the dam and the second substrate in the first direction smaller than the length of the plug which is inside the connector.

In some embodiments, the plug of the second substrate inserted into the plug engaging hole of the connector may dispose the dam in contact with the second substrate.

In some embodiments, the dam may include a first body, and a second body which is connected to the first body and extends therefrom to overlap the second substrate.

In some embodiments, the dam may include a through-hole defined therein through which the second substrate passes, and the second substrate passed through the through-hole may be disposed between the driving substrate and a portion of the dam.

In some embodiments, the dam may be provided in plurality.

In another embodiment, a display apparatus may include a second substrate connecting the first substrate to the driving substrate, including a first connection portion connected to the first substrate and a second connection portion bent and extended from the first connection portion to be connected to the driving substrate, and a first dam overlapping with the first connection portion, the first dam including a first through-hole defined therein through which the first connection portion passes.

The second connection portion is coupled to or engaged with the connector. The second connection portion may extend in the first direction and may be inserted into the connector in a first direction in which the second substrate is insertable into the connector of the driving substrate.

The first dam may prevent the second substrate from moving in a direction opposite to the first direction.

In some embodiments, the display apparatus may further include a second dam.

The second dam may overlap with the second connection portion and may include a second through-hole defined therein through which the second connection portion passes. The second dam may prevent the second substrate from moving in a second direction intersecting the first direction.

In some embodiments, the display apparatus may further include a third dam. The third dam may be spaced apart from the connector in the first direction with the second connection portion interposed therebetween.

The third dam may be disposed adjacent to the second connection portion. The second connection portion of the second substrate inserted into the connector may define: a length of the second substrate in the first direction which is inside the connector, and a distance between the third dam and the second connection portion of the second substrate smaller than the length of the second substrate which is inside the connector.

In some embodiments, the second connection portion of the second substrate inserted into the connector may dispose the third dam in contact with the second connection portion.

In some embodiments, the third dam may include a first body, and a second body which is connected to the first body and overlaps the second connection portion.

BRIEF DESCRIPTION OF THE DRAWINGS

The above and other features of the invention will become more apparent by describing in further detail exemplary embodiments thereof with reference to the accompanying drawings, in which.

DETAILED DESCRIPTION

Figure 1:
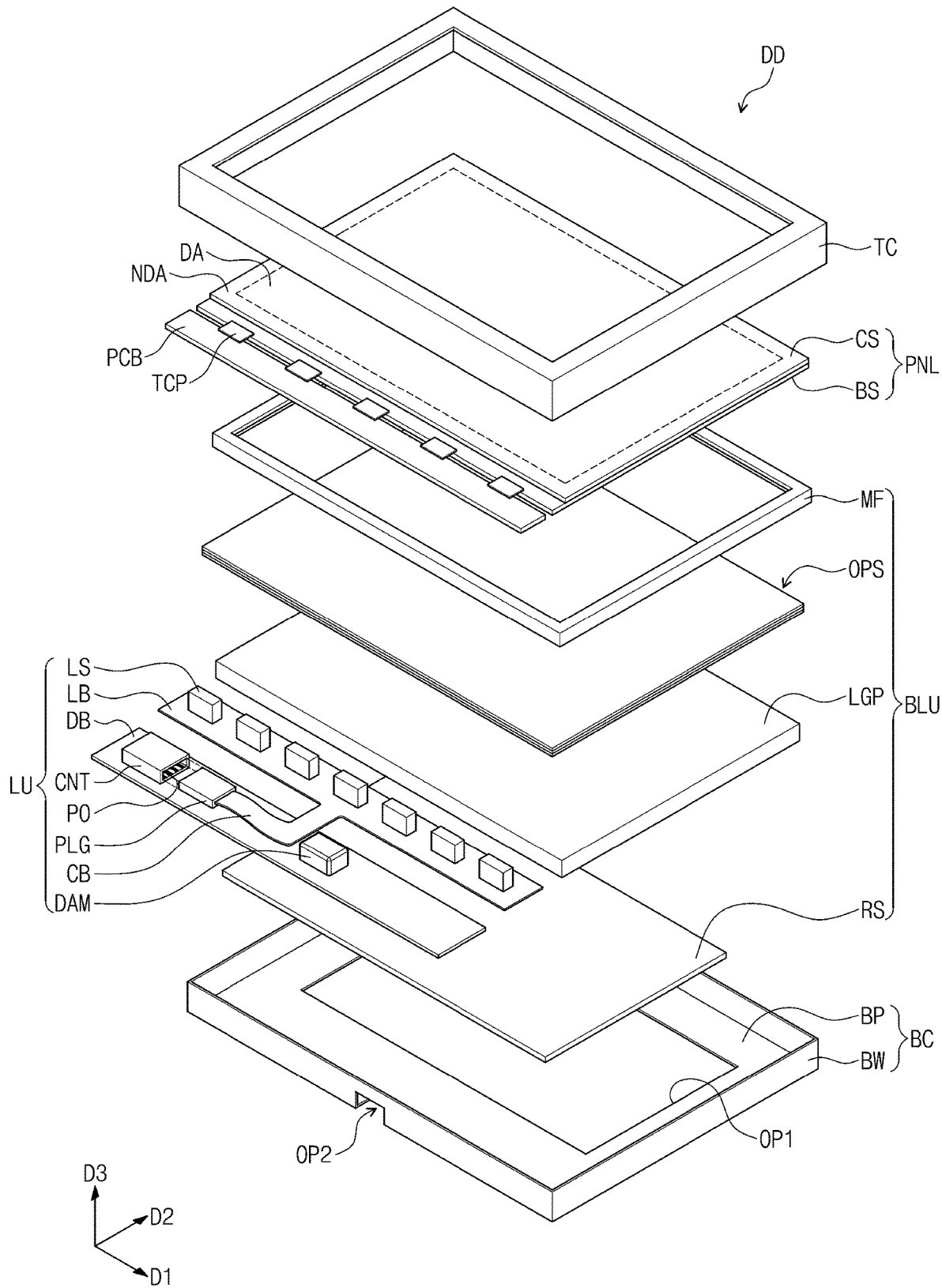
FIG. 1 is an exploded perspective view illustrating an embodiment of a display apparatus according to the invention.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element such as a layer, region or substrate is referred to as being related to another element such as being "on" another element, the element can be directly on the other element or intervening elements may be present. In contrast, when an element such as a layer, region or substrate is referred to as being related to another element such as being "directly on" another element, there are no intervening elements.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings herein.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system).

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross-sectional illustrations and/or plane illustrations that are idealized exemplary illustrations. In the drawings, the thicknesses of layers and regions are exaggerated for clarity. Accordingly, variations from the shapes of the illustrations as a result, for example, of manufacturing techniques and/or tolerances, are to be expected. Thus, exemplary embodiments should not be construed as limited to the shapes of regions illustrated herein but are to include deviations in shapes that result, for example, from manufacturing. For example, an etching region illustrated as a rectangle will, typically, have rounded or curved features. Thus, the regions illustrated in the figures are schematic in nature and their shapes are not intended to illustrate the actual shape of a region of a device and are not intended to limit the scope of exemplary embodiments.

Figure 2:
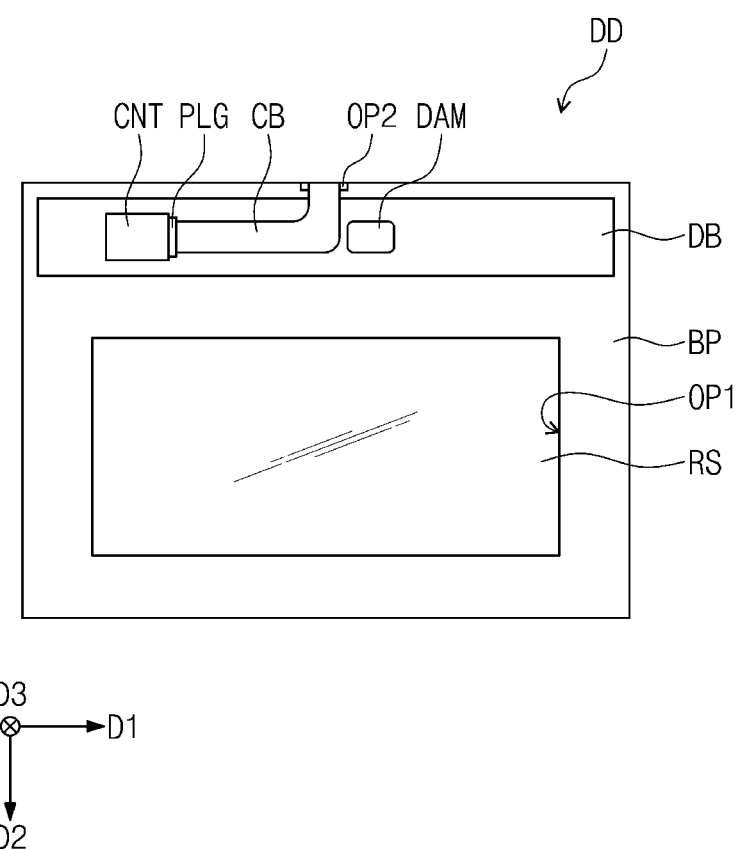
FIG. 2 is an embodiment of a back view of a display apparatus according to the invention.

FIG. 1 is an exploded perspective view illustrating an embodiment of a display apparatus according to the invention, and FIG. 2 is an embodiment of a back view of a display apparatus according to the invention.

Referring to FIG. 1, a display apparatus DD according to an embodiment of the invention may include a display panel PNL, a backlight unit BLU, a mold frame MF, a bottom chassis BC and a top chassis TC.

Here, for the purpose of ease and convenience in description, a direction in which an image is provided in the display apparatus DD is defined as an upward direction. In addition, a direction opposite to the upward direction is defined as a downward direction. However, the upward and downward directions may be relative concepts and may be changed into other directions.

The display panel PNL may receive light from the backlight unit BLU and may generate an image with the received light. The display panel PNL may provide an image through a display surface disposed in a plane defined by a first direction D1 and a second direction D2 which intersects the first direction D1. The upward direction corresponding to the direction in which the image is provided may be indicated by a third direction D3 perpendicular to the first direction D1 and the second direction D2. Thicknesses of the display apparatus DD and/or components thereof are defined in the third direction D3.

The display panel PNL may be a light-receiving display panel and may be, for example, a liquid crystal display panel, an electrowetting display panel, an electrophoretic display panel or a microelectromechanical system ("MEMS") display panel. Hereinafter, the liquid crystal display panel will be described as an example of the display panel PNL.

The display panel PNL may have a quadrilateral plate shape having two pairs of sides, and each pair of sides may be parallel to each other. In an embodiment of the invention, the display panel PNL may have a rectangular shape which has a pair of relatively long sides lengthwise extending in the first direction D1 and a pair of relatively short sides lengthwise extending in the second direction D2.

The display panel PNL may include a display area DA at which the image is displayed, and a non-display area NDA which surrounds the display area DA in a top plan view and at which the image is not displayed.

The display panel PNL may include a base (display) substrate BS, an opposite (display) substrate CS facing the base substrate BS, and an optical control layer such as a liquid crystal layer (not shown) disposed or formed between the base substrate BS and the opposite substrate CS. The base and opposite substrates BS and CS may each have a display area and a non-display area corresponding to those of the display panel PNL.

The base substrate BS includes pixels (not shown) overlapping with the display area DA and at which the image is generated. Each of the pixels may include at least one switching element such as a thin film transistor (not shown) and a pixel electrode (not shown) which is connected to the thin film transistor. The thin film transistor may switch a driving signal provided to the pixel electrode corresponding thereto.

The opposite substrate CS may include a common electrode (not shown) that generates an electric field, which controls liquid crystals of the liquid crystal layer, with the pixel electrodes. Elements of the display panel PNL may drive the liquid crystal layer to control light transmitted therethrough for providing an image in the third direction D3.

A driving chip (not shown), a tape carrier package TCP and a panel printed circuit board PCB may be provided to the display panel PNL. The driving chip may provide the driving signal to the display area of the display panel PNL and may be mounted on the tape carrier package TCP. The panel printed circuit board PCB may be electrically connected to the display panel PNL through the tape carrier package TCP. The panel printed circuit board PCB may generate the driving signal and provide the driving signal to the display panel PNL via the tape carrier package TCP.

The backlight unit BLU may generate light and provide the light to the display panel PNL. The backlight unit BLU may be provided under the display panel PNL. The backlight unit BLU may include a light source unit LU, a light guide plate LGP, a reflection sheet RS and an optical sheet OPS.

The light source unit LU may generate and provide the light and may be disposed at a side of the light guide plate LGP. In the present embodiment, for example, the light source unit LU is disposed at a position corresponding to one long side of the display panel PNL.

The light source unit LU may include a light source LS provided in plurality, a light source substrate LB, a connection substrate CB, a driving substrate DB, a connector CNT and a dam DAM.

The light sources LS may be mounted on a top surface of the light source substrate LB and may be arranged in the first direction D1 such as by equal intervals therebetween. Light generated and emitted from the light sources LS may be provided into the light guide plate LGP. In an embodiment, for example, the light sources LS may use light-emitting diodes ("LEDs") as point light sources. Each of the light sources LS may include a single LED or a plurality of LEDs.

Interconnection (conductive and/or signal) lines may be disposed on the light source substrate LB. The interconnection lines may supply power and/or transmit a power signal and/or a control signal therethrough to the light sources LS to drive and control the light sources LS. The light source substrate LB may have an overall rectangular plate shape of which a length thereof extends in the first direction D1.

The connection substrate CB may connect the light source substrate LB to the driving substrate DB. The connection substrate CB may include interconnection lines that connect the interconnection lines printed on the light source substrate LB to interconnection lines printed on the driving substrate DB.

In the top plan view, the connection substrate CB may have a shape that is bent at least once or has at least one bend. In some embodiments, the connection substrate CB may be a flexible circuit board. Since the connection substrate CB is bent, a position of the driving substrate DB may be variously changed relative thereto.

The connection substrate CB may be integrated with the light source substrate LB as a single unitary body. That is, one of the connection substrate CB and the light source substrate LB may extend to define the other one of the connection substrate CB and the light source substrate LB. However, the embodiments are not limited thereto.

An overall light source substrate may be considered as including a main body (first substrate) LB and a connection portion (second substrate) CB with which the main body is connected to the driving substrate DB. The main body LB may have the overall rectangular plate shape of which the length thereof extends in the first direction D1, while the connection portion CB has lengths which extend in two directions D1 and D2. The main body LB and the connection portion CB are connected such that these portions are movable together or simultaneously. Thus, in the present embodiment, movement of the connection substrate CB relative to the light source substrate LB may be reduced or effectively prevented. This will be described later.

A plug PLG may be connected to one end of the connection substrate CB, such as a distal end of the connection substrate CB. The plug PLG is connected to the driving substrate DB. In particular, the plug PLG may be connected to the driving substrate DB at the connector CNT.

The driving substrate DB may include a light source controller (not shown) that controls the light sources LS such as with power and/or control signals. The light sources LS may be driven by driving power supplied from the light source controller. The driving substrate DB may be adjacent to the light source substrate LB and may be disposed in parallel to the light source substrate LB. That is, driving substrate DB may have an overall rectangular plate shape of which a length thereof extends in the first direction D1.

The connector CNT may be disposed on the driving substrate DB, such as to be connected thereto. The connector CNT may be fixed on the driving substrate DB by a method such as a surface mounting technology. A plug engaging hole P0 is defined in and/or by the connector CNT. The plug PLG is insertable into the plug engaging hole P0 to connect the plug PLG to the connector CNT. In the present embodiment, a direction D1 in which the plug PLG is insertable into the plug engaging hole P0 is indicated by an arrow (refer to FIGS. 3A and 3B), and the direction D1 may be parallel to the first direction D1. The first direction D1 may be considered a direction opposite to the insertion direction D1.

With the plug PLG of the connection substrate CB engaged with the plug engaging hole P0 to be connected to the connector CNT of the driving substrate DB, the driving substrate DB may be electrically connected to the light source substrate LB to control the light sources LS.

The dam DAM may be disposed adjacent to another end of the connection substrate CB, which is opposite to the one (distal) end of the connection substrate CB in the first direction D1. The dam DAM may face the connector CNT along the first direction D1, with the connection substrate CB interposed therebetween.

The dam DAM may be fixed on the driving substrate DB by a method such as a surface mounting technology. Alternatively, the dam DAM may be attachable on and detachable from the driving substrate DB. In an embodiment, for example, a hook (not shown) may be provided on a bottom surface of the dam DAM and with which the dam DAM is attachably/detachably coupled to the driving substrate DB.

In the present embodiment, the dam DAM has a hexahedral shape. However, embodiments of the invention are not limited thereto. In certain embodiments, the dam DAM may have at least one of other various three-dimensional shapes.

The dam DAM may restrict or effectively prevent movement of the connection substrate CB relative to the driving substrate DB. In the present embodiment, a direction of the movement of the connection substrate CB may be parallel to the first direction D1. The dam DAM may be disposed on the driving substrate DB so as to be adjacent to the connection substrate CB, and thus it is possible to restrict or effectively prevent separation of the connection substrate CB from the connector CNT on the driving substrate DB.

The light guide plate LGP may guide the light provided into the light guide plate LGP toward the display panel PNL. The light guide plate LGP may be disposed under the display panel PNL. The light guide plate LGP may include or be formed of a transparent polymer resin such as polycarbonate or polymethyl methacrylate. The light guide plate LGP includes or defines a light exit surface facing the display panel PNL, an opposite surface disposed opposite to the light exit surface, and side surfaces which each connect the light exit and opposite surfaces to each other. One or more of the side surfaces of the light guide plate LGP may be an incident surface through which light from the light source unit LU is incident into the light guide plate LGP.

The reflection sheet RS may be disposed under the light guide plate LGP. The reflection sheet RS may include a base material formed of polyethylene terephthalate ("PET"), and a light-reflecting material (e.g., aluminum (Al)) included in (or added to) the base material. The reflection sheet RS may reflect light which is not outputted through the light exit surface of the light guide plate LGP but is leaked through the opposite surface of the light guide plate LGP. The light reflected by the reflection sheet RS may be provided again into the light guide plate LGP.

The optical sheet OPS may be provided between the light guide plate LGP and the display panel PNL. The optical sheet OPS controls the light emitted from the light sources LS and output from the light guide plate LGP. The optical sheet OPS may include a collection of individual sheets such as a diffusion sheet, a prism sheet and a protective sheet which are stacked on the light guide plate LGP.

The mold frame MF may be disposed between the display panel PNL and the bottom chassis BC. The mold frame MF may be disposed under the display panel PNL to support the display panel PNL. In addition, the mold frame MF may fix a position of the light source unit LU within the display apparatus DD.

The bottom chassis BC may receive the backlight unit BLU and the mold frame MF. The bottom chassis BC may include a bottom portion BP disposed under the reflection sheet RS and a sidewall portion BW which is connected to the bottom portion BP and extends from edges thereof toward the display panel PNL. The bottom portion BP together with the sidewall portion BS may define a receiving space of the bottom chassis BC in which other components of the display device DD are received.

The bottom portion BP may have a frame shape in the top plan view. A first opening OP1 overlapping with the display area DA may be defined in or by the bottom portion BP. Since the reflection sheet RS is disposed on the bottom portion BP, a top surface of the bottom portion BP and the first opening OP1 may be covered by the reflection sheet RS. A back surface of the reflection sheet RS may be exposed outside the display device DD at the first opening OP1. In the present embodiment, the first opening OP1 is defined in the bottom portion BP. However, embodiments of the invention are not limited thereto. In certain embodiments, the bottom portion BP may have a quadrilateral plate shape in which no opening is defined. In this case, the reflection sheet RS may be disposed on the top surface of the bottom portion BP, such as on an entirety thereof.

The sidewall portion BW may be bent and extended from the bottom portion BP. The sidewall portion BW may be integrated with the bottom portion BP as a single unitary body or may be provided separately from the bottom portion BP and then assembled with the bottom portion BP so as to be attachable and detachable from the bottom portion BP.

In the present embodiment, a second opening OP2 through which the connection substrate CB passes may be defined in the bottom chassis BC. The second opening OP2 may be defined in a connection portion of the bottom portion BP and the sidewall portion BW. The connection portion may include an interface at which portions of the bottom portion BP and the sidewall portion BW meet.

Referring to FIG. 2, the connection substrate CB may pass through the second opening OP2 from the receiving space of the bottom chassis BC. The connection substrate CB extended from the receiving space to outside the bottom chassis BC may be bent. Thus, the connection substrate CB and the driving substrate DB which is connected to the connection substrate CB may be located outside the bottom chassis BC such as on a back surface of the bottom chassis BC exposed to outside the display apparatus DD. The driving substrate DB may be fixed on a bottom (back) surface of the bottom portion BP, which is opposite to the top surface of the bottom portion BP.

In the present embodiment, the driving substrate DB is located on the back surface of the bottom chassis BC. However, embodiments of the invention are not limited thereto. In certain embodiments, the driving substrate DB may be disposed at a side of the light source substrate LB so as to be disposed in the bottom chassis BC such as in the receiving space thereof.

The top chassis TC may be disposed on the display panel PNL. The top chassis TC may cover the non-display area NDA of the display panel PNL. The top chassis TC may be engaged with or coupled to the bottom chassis BC.

Figure 3A:
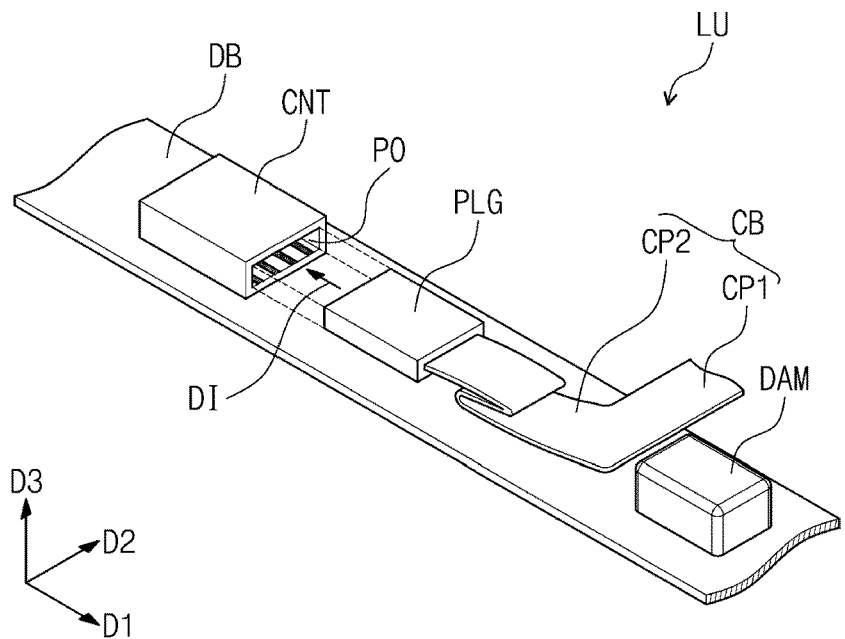
FIGS. 3A and 3B are perspective views illustrating an embodiment of a light source unit according to the invention.
Figure 3B:
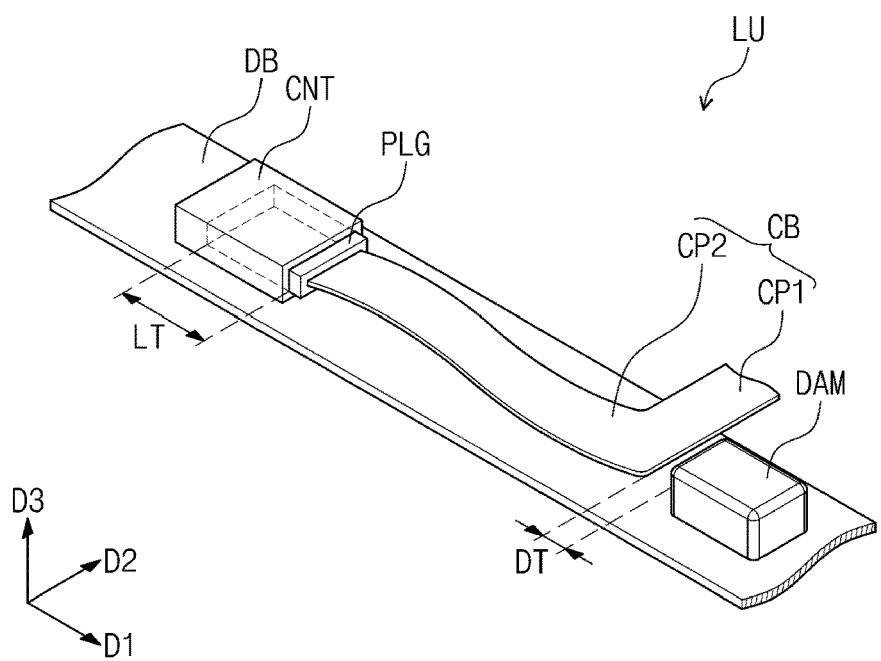
Figure 4:
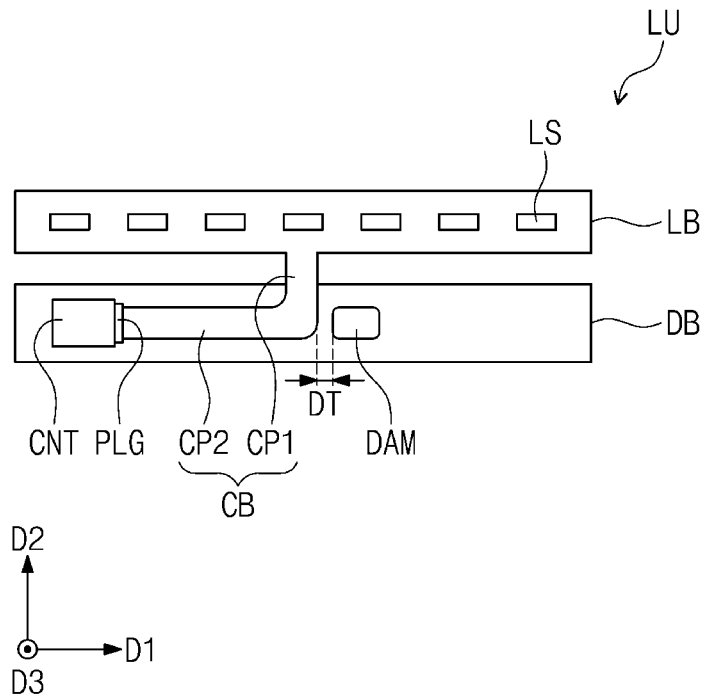
FIG. 4 is a top plan view illustrating the light source unit of FIGS. 3A and 3B according to the invention.

FIGS. 3A and 3B are perspective views illustrating an embodiment a light source unit according to the invention. FIG. 4 is a top plan view illustrating the light source unit in FIGS. 3A and 3B according to the invention. Hereinafter, the light source unit LU will be described in more detail with reference to FIGS. 3A, 3B and 4.

FIG. 3A illustrates a state of the light source unit LU with the plug PLG disconnected from the connector CNT, such a state before the plug PLG is inserted into the connector CNT, and FIG. 3B illustrates a state of the light source unit LU with the plug PLG connected to the connector CNT, such as being inserted into the plug engagement hole P0 thereof.

Referring to FIGS. 3A, 3B and 4, the connection substrate CB may include a first connection portion CP1 and a second connection portion CP2. The first connection portion CP1 may be connected to the light source substrate LB and may lengthwise extend in the second direction D2. The second connection portion CP2 may be bent from the first connection portion CP1 and may lengthwise extend in the first direction D1.

The plug PLG may be located at one (distal) end of the second connection portion CP2 and may be connected to the one end of the second connection portion CP2. In the state of the light source unit LU with the plug PLG connected to the connector CNT, at least a portion of the plug PLG is disposed within the plug engaging hole P0 of the connector CNT such as being insertable thereto in the insertion direction D1 (e.g., the first direction D1).

The connector CNT, the second connection portion CP2 and the dam DAM may be arranged in the first direction D1. The dam DAM and the second connection portion CP2 may be spaced apart from each other in the first direction D1 by a predetermined distance DT. Referring to FIG. 3B, for example, with the length of the second connection portion CP2 maximally extended in the first direction D1, the dam DAM and the second connection portion CP2 may be spaced apart from each other in the first direction D1 by the predetermined distance DT.

The distance DT is shorter than a length LT of the portion, which is inserted in the plug engaging hole P0, of the plug PLG. In an embodiment, for the connection substrate CB to be detached from the connector CNT, an entirety of the length LT of the plug PLG is disposed outside the connector CNT. However, since movement of the second connection portion CP2 is restricted in the first direction D1 to a maximum of the distance DT shorter than the length LT, the entirety of the length LT of the plug PLG is not disposed outside the connector CNT. Thus, the dam DAM may reduce or effectively prevent detachment of the connection substrate CB from the connector CNT by movement of the light source substrate LB and/or the driving substrate DB relative to each other.

The dam DAM may be disposed at one of various positions along the driving substrate DB, under a condition that a distance between the dam DAM and an end of the second connection portion CP2 opposite to the distal end thereof, is equal to or less than the distance DT which is less than the length LT described above. However, embodiments of the invention are not limited to a specific embodiment.

In the present embodiment, the dam DAM is aligned with the second connection portion CP2 along the first direction D1. However, embodiments of the invention are not limited thereto. In certain embodiments, the dam DAM may be disposed adjacent to one side of the first connection portion CP1 which is connected to the second end of the second connection portion CP2. In addition, as a size of the dam DAM is changed, the dam DAM may be disposed at the one side of the first connection portion CP1 and the second end of the second connection portion CP2.

Hereinafter, light source units according to other embodiments of the invention will be described with reference to the drawings. For the purpose of ease and convenience in description, differences between the following embodiments and the above embodiments will be mainly described and the same descriptions as in the above embodiments will be omitted. In addition, the same elements as described above will be indicated by the same reference numerals or the same reference designators, and the descriptions thereto will be omitted or mentioned briefly.

Figure 5:
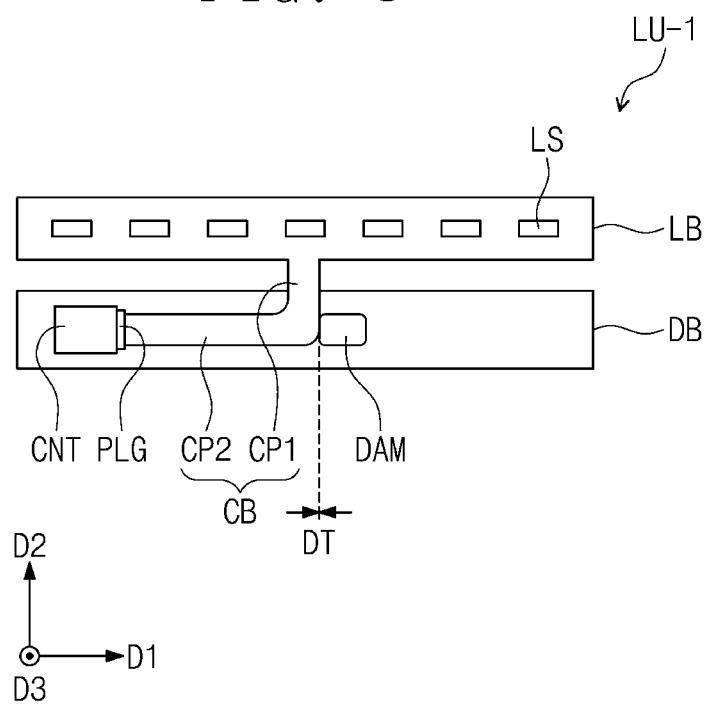
FIG. 5 is a top plan view illustrating another embodiment of a light source unit according to the invention.

FIG. 5 is a top plan view illustrating another embodiment of a light source unit according to the invention.

Referring to FIG. 5, in a light source unit LU-1 according to another embodiment of the invention, the dam DAM may be disposed to face the connector CNT with the second connection portion CP2 interposed therebetween. The dam DAM, the second connection portion CP2 and the connector CNT may be arranged in the first direction D1. The distance DT between the dam DAM and the second connection portion CP2 may be 0 (zero), such that the DAM is disposed to be in contact with the second connection portion CP2. Since the dam DAM is disposed to be in contact with the second connection portion CP2, restricting or effectively preventing movement of the light source substrate LB and/or the driving substrate DB in the first direction D1. As a result, disconnection of the connection substrate CB from the connector CNT may be reduced or effectively prevented.

Figure 6:
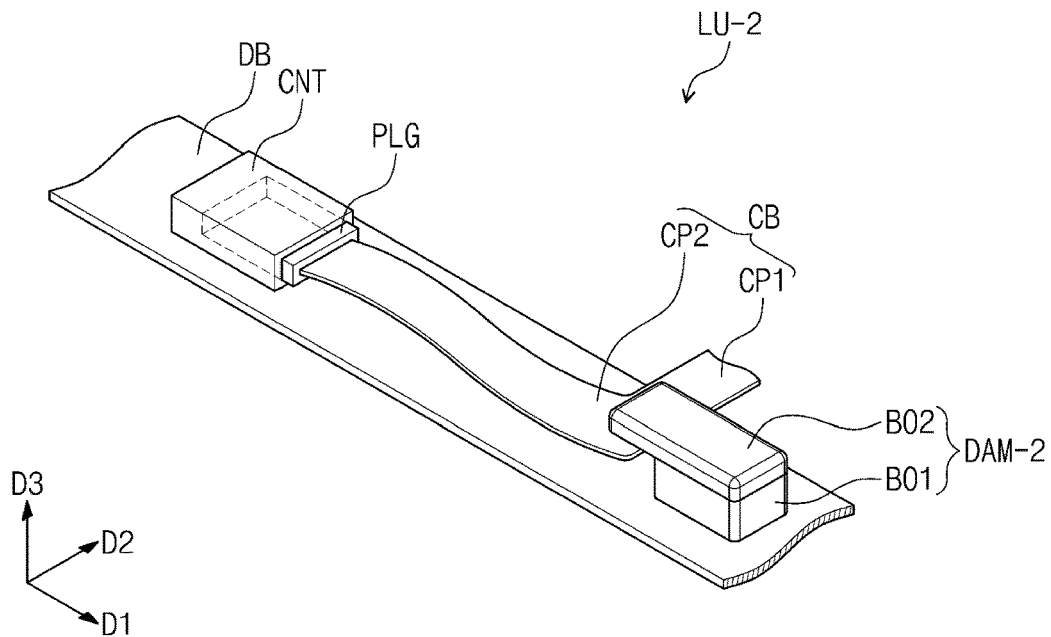
FIG. 6 is a perspective view illustrating still another embodiment of a light source unit according to the invention.

FIG. 6 is a perspective view illustrating still another embodiment of a light source unit according to the invention.

Referring to FIG. 6, in a light source unit LU-2 according to still another embodiment of the invention, a dam DAM-2 may include a first body B01 and a second body B02.

The first body B01 may be disposed to face the connector CNT with the second connection portion CP2 interposed therebetween. The first body B01 may be spaced apart from the second connection portion CP2 in the first direction D1 by a certain distance, such as the distance DT described above. The first body B01 may inhibit or effectively prevent movement of the second connection portion CP2 in the first direction D1, and thus disconnection of the connection substrate CB from the connector CNT may be reduced or effectively prevented.

The first body B01 may have a hexahedral shape. However, embodiments of the invention are not limited thereto. In certain embodiments, the first body B01 may have one of other various three-dimensional shapes.

The second body B02 may be disposed on the first body B01 and on the second connection portion CP2. In the third direction D3, the second body B02 may be disposed further from an upper surface of the driving substrate DB than each of the first body B01 and the second connection portion CP2. The second body B02 may overlap with at least a portion of the second connection portion CP2. As a result, the second body B02 may inhibit or effectively prevent movement of the second connection portion CP2 in the third direction D3, and thus a coupling force between the connection substrate CB and the connector CNT may be improved.

Since the first body B01 is coupled to the second body B02, the dam DAM-2 may have a collective bent shape in the third direction DR3. In the present embodiment, the first body B01 and the second body B02 are distinguished from each other. However, embodiments of the invention are not limited thereto. In certain embodiments, the first body B01 may be integrally formed with the second body B02 as a single unitary body.

Figure 7:
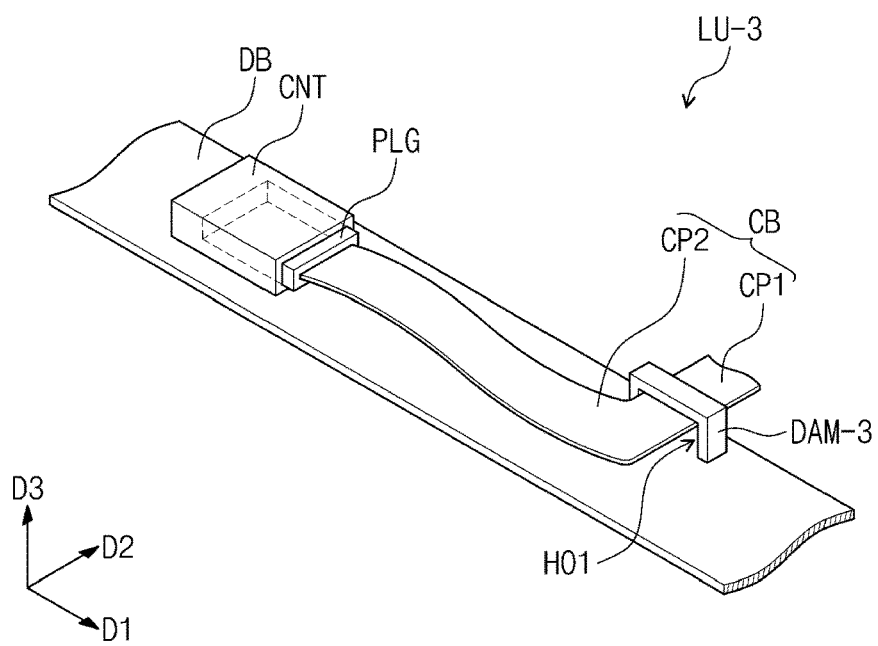
FIG. 7 is a perspective view illustrating yet another embodiment of a light source unit according to the invention.
Figure 8:
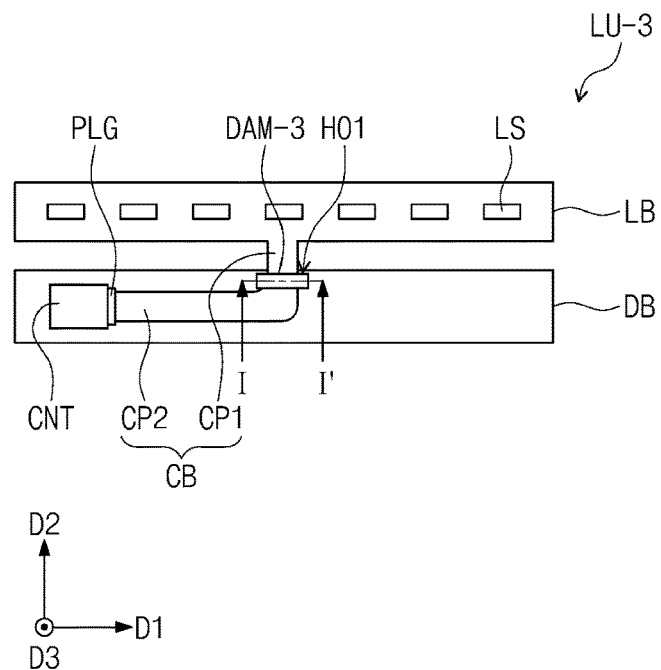
FIG. 8 is a top plan view illustrating the light source unit of FIG. 7 according to the invention.
Figure 9:
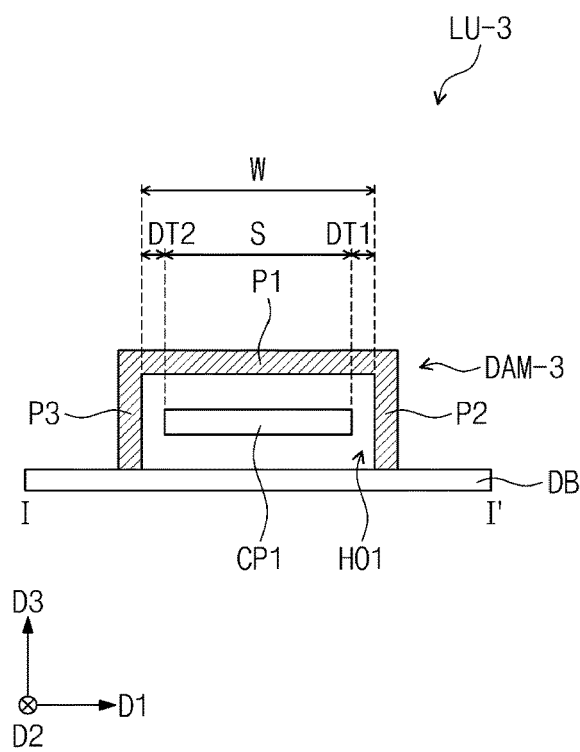
FIG. 9 is a cross-sectional view taken along line I-I' of FIG. 8.

FIG. 7 is a perspective view illustrating yet another embodiment of a light source unit according to the invention, and FIG. 8 is a top plan view illustrating the light source unit of FIG. 7 according to the invention. FIG. 9 is a cross-sectional view taken along line I-I' of FIG. 8.

Referring to FIGS. 7 and 8, in a light source unit LU-3 according to yet another embodiment of the invention, a dam DAM-3 may be mounted on the driving substrate DB with a portion of the connection substrate CB interposed therebetween.

The dam DAM-3 may have a tunnel shape through which the connection substrate CB passes. Thus, the dam DAM-3 may overlap with a portion of the connection substrate CB. In the present embodiment, the dam DAM-3 may overlap with the first connection portion CP1.

Referring to FIG. 9, the dam DAM-3 may include a first portion P1, a second portion P2 and a third portion P3. The first through third portions P1, P2 and P3 may be integrated with each other as a single unitary body. However, embodiments of the invention are not limited thereto.

The first portion P1 may overlap with the first connection portion CP1 and may face the driving substrate DB with the first connection portion CP1 interposed therebetween. The first portion P1 may be parallel with the driving substrate DB, however, the invention is not limited thereto.

The second portion P2 and the third portion P3 may be bent and extended from opposing ends of the first portion P1, respectively, so as to be connected to the driving substrate DB. The second portion P2 and the third portion P3 may be disposed in parallel to each other with the first connection portion CP1 interposed therebetween. The second portion P2 and the third portion P3 are inclined with respect to the first portion P1 and the driving substrate DB.

The second portion P2 and the third portion P3 are respectively disposed at two opposing sides of the first connection portion CP1, to restrict movement thereof in the first direction D1 and a direction opposite thereto. The second portion P2 and the third portion P3 may be spaced apart from the first connection portion CP1 in the first direction D1 by a first distance DT1 and a second distance DT2, respectively. Each of the first and second distances DT1 and DT2 may be equal to the distance DT of FIG. 3B. That is, of the first and second distances DT1 and DT2 may be shorter than a length LT of the portion, which is inserted in the plug engaging hole P0, of the plug PLG.

The dam DAM-3 may have or define a first through-hole H01 through which the first connection portion CP1 passes. The first through-hole H01 may be defined by the first portion P1, the second portion P2, the third portion P3 and the driving substrate DB.

A width W of the first through-hole H01 may be equal to a distance between inner walls of the second portion P2 and the third portion P3. The width W may be equal to a sum of a width S of the first connection portion CP1, the first distance DT1 and the second distance DT2.

The dam DAM-3 may inhibit or effectively prevent movement of the connection substrate CB in each of the first, second and the third directions D1, D2 and D3. Thus, the coupling force between the connection substrate CB and the connector CNT may be improved.

Figure 10:
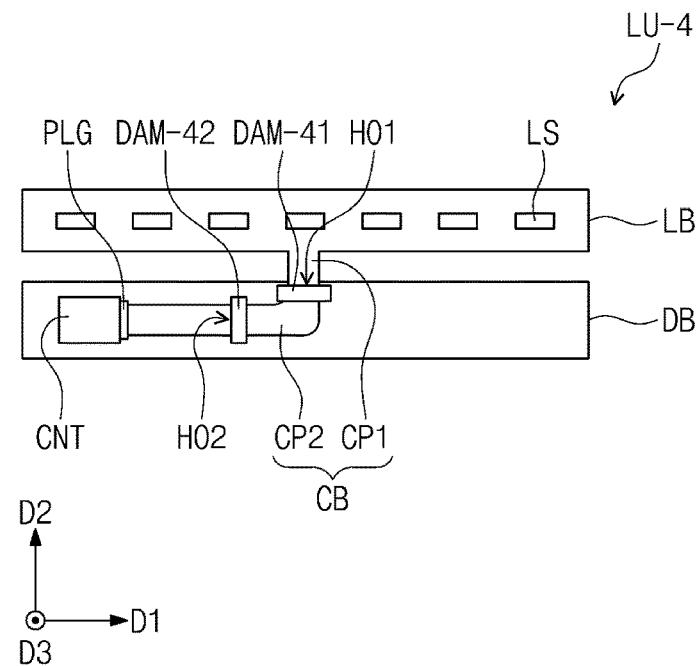
FIG. 10 is a top plan view illustrating yet another embodiment of a light source unit according to the invention.

FIG. 10 is a top plan view illustrating yet another embodiment of a light source unit according to the invention.

Referring to FIG. 10, a light source unit LU-4 according to yet still another embodiment of the invention may include a plurality of dams. The light source unit LU-4 may include a first dam DAM-41 and a second dam DAM-42 which each have a tunnel shape.

The first dam DAM-41 may be disposed to overlap with the first connection portion CP1. The first dam DAM-41 may have a first through-hole H01 through which the first connection portion CP1 passes.

The first dam DAM-41 may restrict or effectively prevent movement of the connection substrate CB in the first direction D1 and the third direction D3. The second portion and the third portion (refer to P2 and P3 in FIG. 9) of the first dam DAM-41 are respectively disposed at two opposing sides of the first connection portion CP1 in the width direction thereof, to restrict movement thereof in the first direction D1 and a direction opposite thereto.

The second dam DAM-42 may be disposed to overlap with the second connection portion CP2. The second dam DAM-42 may have a second through-hole H02 through which the second connection portion CP2 passes.

The second dam DAM-42 may restrict or effectively prevent movement of the connection substrate CB in the second direction D2 and the third direction D3. The second portion and the third portion (refer to P2 and P3 in FIG. 9) of the second dam DAM-42 are respectively disposed at two opposing sides of the second connection portion CP2 in the width direction thereof, to restrict movement thereof in the second direction D2 and a direction opposite thereto.

Since the light source unit LU-4 includes the first dam DAM-41 and the second dam DAM-42, the coupling force between the light source substrate LB and the driving substrate DB may be further improved.

Figure 11:
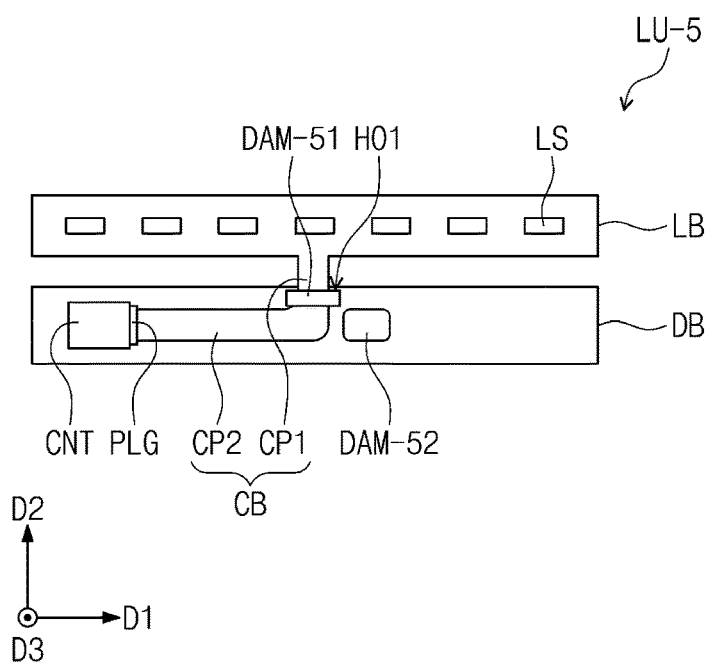
FIG. 11 is a top plan view illustrating yet another embodiment of a light source unit according to the invention.

FIG. 11 is top a plan view illustrating yet another embodiment of a light source unit according to the invention.

Referring to FIG. 11, a light source unit LU-5 according to yet still another embodiment of the invention may include a plurality of dams DAM-51 and DAM-52.

A third dam DAM-51 may be disposed to overlap with the first connection portion CP1. The third dam DAM-51 may have a first through-hole H01 through which the first connection portion CP1 passes.

The third dam DAM-51 may restrict or effectively prevent movement of the connection substrate CB in directions parallel to the first direction D1, and the third direction D3.

A fourth dam DAM-52 may be disposed to face the connector CNT with the second connection portion CP2 interposed therebetween. The fourth dam DAM-52 may restrict or effectively prevent movement of the connection substrate CB in the first direction D1.

Since the light source unit LU-5 includes the third dam DAM-51 and the fourth dam DAM-52, the coupling force between the light source substrate LB and the driving substrate DB may be further improved.

The display apparatus according to one or more embodiment of the invention may improve assembly reliability between the light source substrate and the driving substrate.

While the invention has been described with reference to example embodiments, it will be apparent to those skilled in the art that various changes and modifications may be made without departing from the spirit and scope of the invention. Therefore, it should be understood that the above embodiments are not limiting, but illustrative. Thus, the scope of the invention are to be determined by the broadest permissible interpretation of the following claims and their equivalents, and shall not be restricted or limited by the foregoing description.

What is claimed is:

1. A display apparatus comprising:
a display panel which displays an image with light; and
a backlight unit which provides the light to the display panel,
wherein the backlight unit comprises:
   a light source which generates and emits the light;
   a first substrate on which the light source is mounted;
   a driving substrate which supplies driving power to the light source mounted on the first substrate;
   a second substrate connecting the first substrate to the driving substrate;
   a connector mounted on the driving substrate and coupled to the second substrate; and
   a dam mounted on the driving substrate and facing the connector with the second substrate interposed therebetween, the dam restricting movement of the second substrate in a direction away from the connector.

2. The display apparatus of claim 1, wherein in a top plan view, the second substrate connecting the first substrate to the driving substrate is bent at least once.

3. The display apparatus of claim 2, wherein
the second substrate connecting the first substrate to the driving substrate comprises a plug at a first end of the second substrate, and
the connector comprises a plug engaging hole defined therein into which the plug of the second substrate is insertable, in a first direction.

4. The display apparatus of claim 3, wherein
the dam, the second substrate and the connector are spaced apart from each other in the first direction,
the plug of the second substrate inserted into the plug engaging hole of the connector defines:
   a length of the plug in the first direction which is inside the connector, and
   a distance between the dam and the second substrate in the first direction smaller than the length of the plug which is inside the connector.

5. The display apparatus of claim 3, wherein the plug of the second substrate inserted into the plug engaging hole of the connector disposes the dam in contact with the second substrate.

6. The display apparatus of claim 1, wherein the dam comprises:
a first body mounted on the driving substrate; and
a second body connected to the first body and extending therefrom to overlap the second substrate connecting the first substrate to the driving substrate.

7. The display apparatus of claim 1, wherein
the dam includes a through-hole defined therein through which the second substrate passes, and
the second substrate passed through the through-hole is disposed between the driving substrate and a portion of the dam.

8. The display apparatus of claim 7, wherein the dam including the through-hole defined therein is provided in plurality.

9. A display apparatus comprising:
a display panel which displays an image with light; and
a backlight unit which provides the light to the display panel,
wherein the backlight unit comprises:

a light source which generates and emits the light;
a first substrate on which the light source is mounted;
a driving substrate which supplies driving power to the light source mounted on the first substrate;
a second substrate connecting the first substrate to the driving substrate, the second substrate comprising:
   a first connection portion at a first end of the second substrate to be connected to the first substrate on which the light source is mounted; and
   a second connection portion at a second end of the second substrate opposite to the first end thereof to be connected to the driving substrate, the second connection portion extended bent from the first connection portion to be connected to the driving substrate;
a connector mounted on the driving substrate and into which the second connection portion of the second substrate is insertable; and
a first dam mounted on the driving substrate to overlap the first connection portion of the second substrate, the first dam including a first through-hole defined therein through which the first connection portion of the second substrate passes.

10. The display apparatus of claim 9, wherein
the second connection portion of the second substrate lengthwise extends in a first direction in which the second connection portion is insertable into the connector of the driving substrate, and
the first dam restricts movement of the second substrate in a direction opposite to the first direction.

11. The display apparatus of claim 10, further comprising:
a second dam mounted on the driving substrate to overlap the second connection portion of the second substrate, the second dam including a second through-hole defined therein through which the second connection portion of the second substrate passes,
wherein the second dam restricts movement of the second substrate in a second direction intersecting the first direction.

12. The display apparatus of claim 10, further comprising:
a third dam mounted on the driving substrate to be spaced apart from the connector thereof in the first direction with the second connection portion of the second substrate interposed therebetween.

13. The display apparatus of claim 12, wherein
the third dam is disposed adjacent to the second connection portion of the second substrate,
the second connection portion of the second substrate inserted into the connector defines:
   a length of the second substrate in the first direction which is inside the connector, and
   a distance between the third dam and the second connection portion of the second substrate smaller than the length of the second substrate which is inside the connector.

14. The display apparatus of claim 12, wherein the second connection portion of the second substrate inserted into the connector disposes the third dam in contact with the second connection portion of the second substrate.

15. The display apparatus of claim 12, wherein the third dam comprises:
a first body mounted on the driving substrate; and
a second body connected to the first body and extending therefrom to overlap the second connection portion of the second substrate connecting the first substrate to the driving substrate.

16. The display apparatus of claim 9, wherein the first substrate on which the light source is mounted is integrated with the second substrate connecting the first substrate to the driving substrate, as a single unitary body.

17. A display apparatus comprising:
a display panel which displays an image with light; and
a backlight unit which generates and provides the light to the display panel,
wherein the backlight unit comprises:
- a light source which generates and emits the light;
- a first substrate on which the light source is mounted;
- a driving substrate which supplies driving power to the light source mounted on the first substrate;
- a second substrate connecting the first substrate to the driving substrate;
- a connector mounted on the driving substrate and into which the second substrate is insertable; and
- a dam mounted on the driving substrate to be disposed adjacent to the second substrate connecting the first substrate to the driving substrate, wherein the second substrate comprises:
- a first connection portion at a first end of the second substrate to be connected to the first substrate on which the light source is mounted; and
- a second connection portion at a second end of the second substrate to be connected to the driving substrate, the second connection portion bent from the first connection portion to extend in a first direction in which the second connection portion is insertable into the connector, wherein
the dam comprises a first dam mounted on the driving substrate to overlap the first connection portion of the second substrate connecting the first substrate to the driving substrate, the first dam including a first through-hole defined therein through which the first connection portion of the second substrate passes, and
the first dam restricts movement of the second substrate in a direction opposite to the first direction.

18. The display apparatus of claim 17, wherein
the dam further comprises a second dam mounted on the driving substrate to overlap the second connection portion of the second substrate connecting the first substrate to the driving substrate, the second dam including a second through-hole defined therein through which the second connection portion of the second substrate passes, and
the second dam restricts movement of the second substrate in a second direction intersecting the first direction.

19. The display apparatus of claim 17, wherein
the dam further comprises a third dam mounted on the driving substrate to be spaced apart from the connector in the first direction with the second connection portion of the second substrate interposed therebetween,
the third dam restricts movement of the second substrate in a second direction intersecting the first direction.

* * * * *